(12) United States Patent
O'Brien

(10) Patent No.: US 6,307,298 B1
(45) Date of Patent: Oct. 23, 2001

(54) ACTUATOR AND METHOD OF MANUFACTURE

(75) Inventor: Gary J. O'Brien, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/531,697

(22) Filed: Mar. 20, 2000

(51) Int. Cl.$^7$ ...................................................... H02N 1/00
(52) U.S. Cl. ................................................................ 310/309
(58) Field of Search ............................................. 310/309

(56) References Cited

U.S. PATENT DOCUMENTS 3,225,225 * 12/1965 Wattendorf et al. ................... 310/309
3,769,531 * 10/1973 Elkuch .................................. 310/309

* cited by examiner

*Primary Examiner*—Nestor Ramirez
*Assistant Examiner*—Judson H. Jones

(57) ABSTRACT

An actuator includes a support layer (110), a stationary structure (130) located over the support layer and including two portions (131, 132, 731, 732, 831, 832) adjacent to each other and separated from each other by a gap (133), and a movable structure (140, 240, 340, 440, 540, 650, 740, 840) coupled to and located over the support layer, located adjacent to the stationary structure, and movable relative to the stationary structure and the support layer. A portion (143, 243, 343, 443, 543, 643, 743, 843) of the movable structure is located in the gap between the two portions of the stationary structure, and the portion of the movable structure comprises a body (144) and an asymmetric structure (145, 245, 345, 445, 545, 645, 745, 845) extending from the body.

16 Claims, 4 Drawing Sheets

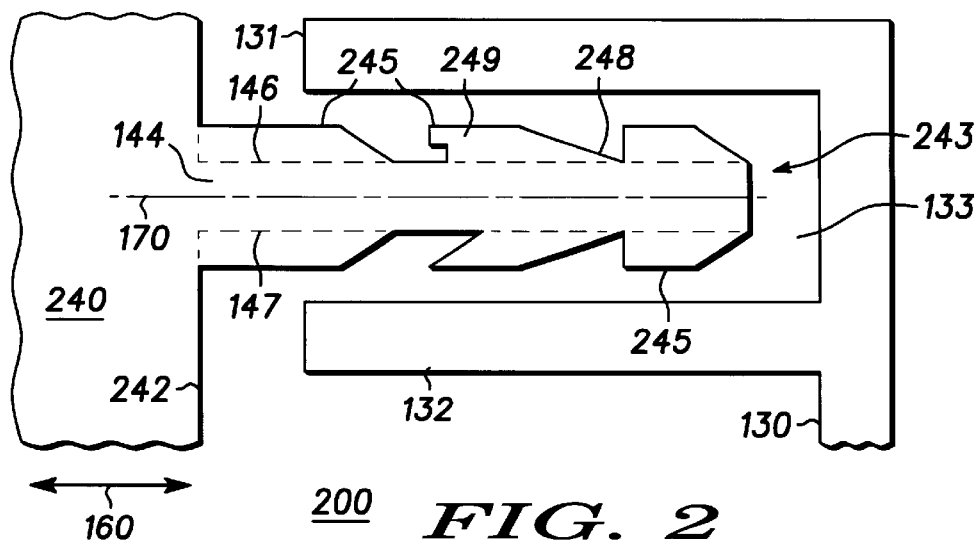
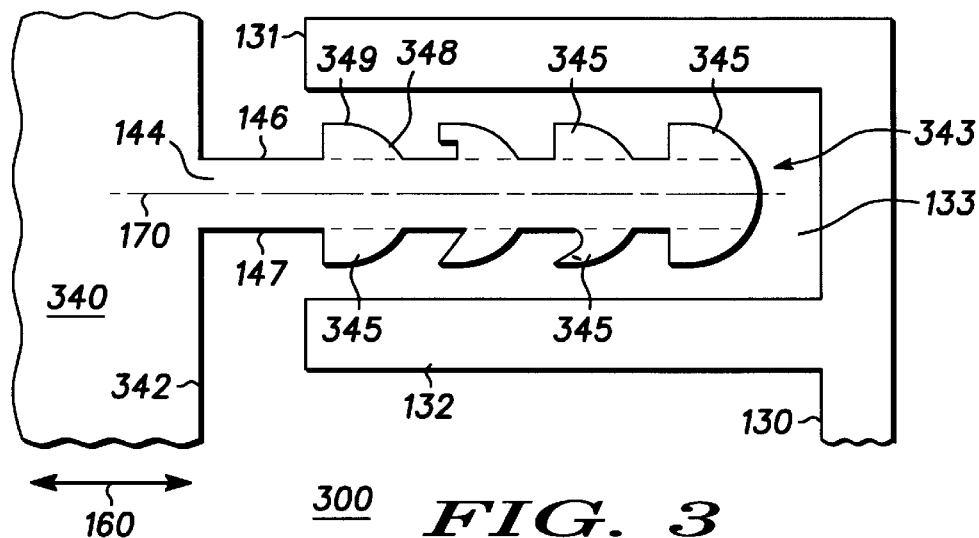
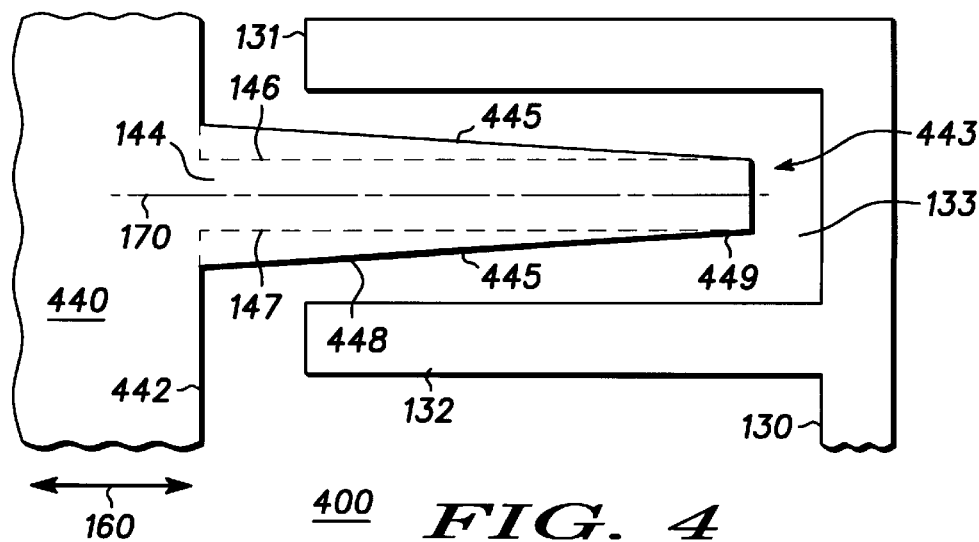

ACTUATOR AND METHOD OF MANUFACTURE

FIELD OF THE INVENTION

This invention relates, in general, to electronics, and more particularly, to actuators and their methods of manufacture.

BACKGROUND OF THE INVENTION

Resonators, Coriolis accelerometers, and radial actuators are two examples of the many different types of actuators. A common problem of all types of actuators is the need to use large actuation voltages. These large voltages are required to produce a sufficient electrostatic force to move the actuators. However, these large voltages also decrease the battery-life for portable applications. To decrease the magnitude of the voltage, the size of the actuator can be increased. However, this increased size also increases the cost of the actuator. Accordingly, a need exists for an actuator that can use lower actuation voltages while still generating sufficient electrostatic force to move the actuator and while decreasing or at least maintaining the size and cost of the actuator.

BRIEF DESCRIPTIONS OF THE DRAWINGS

Figure 1:
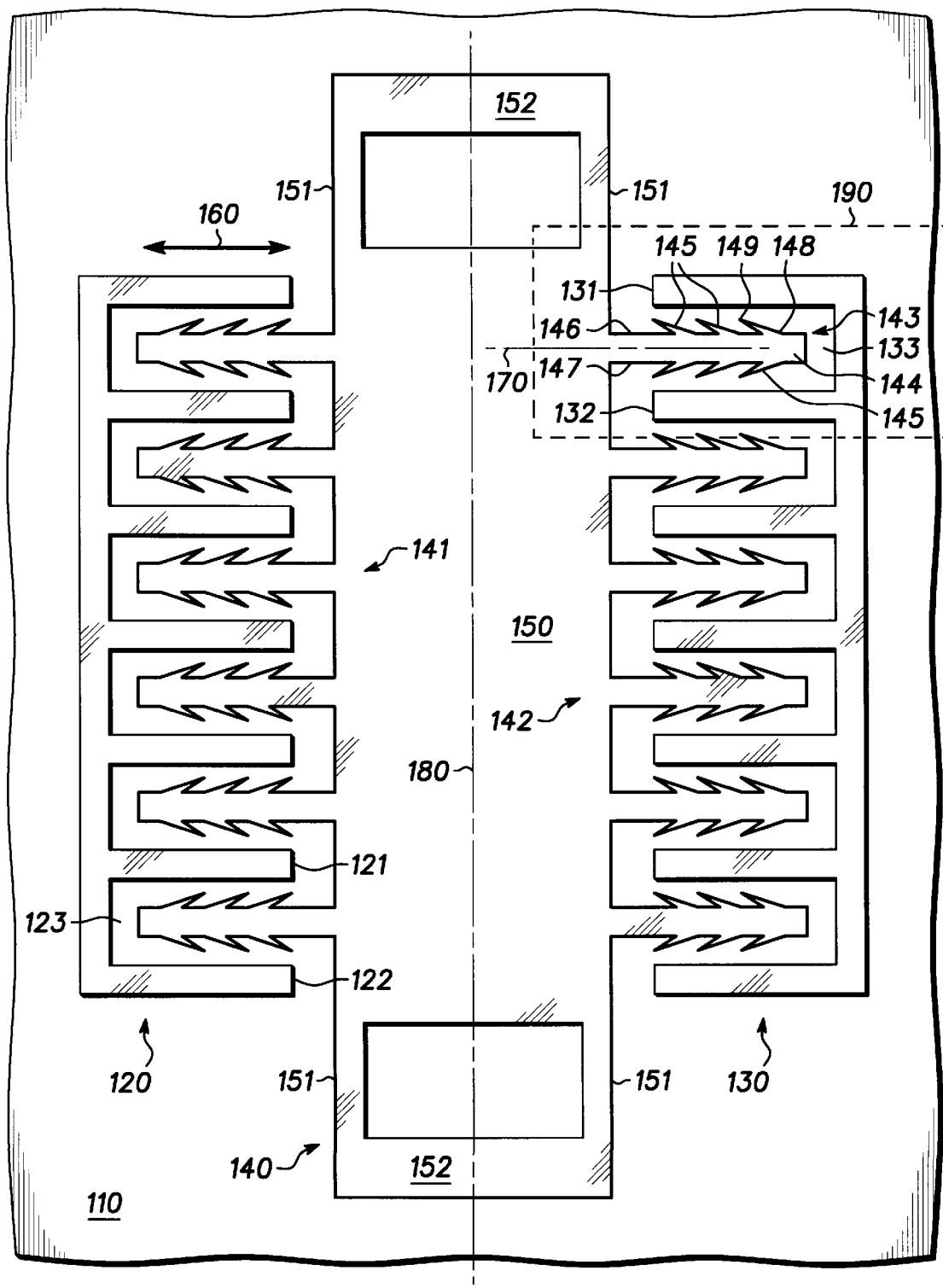

The invention will be better understood from a reading of the following detailed description, taken in conjunction with the accompanying drawing figures in which:

FIG. 1 illustrates a top view of an actuator in accordance with an embodiment of the invention; and FIGS. 2 through 8 illustrate top views of a portions of different actuators in accordance with different embodiments of the invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the invention. Furthermore, the terms first, second, overlie, underlie, top, bottom, and the like in the description and in the claims, if any, are used for descriptive purposes. However, it is understood that the embodiments of the invention described herein are capable of operation in other orientations than described or illustrated herein. It is further understood that the terms so used are for the purposes of describing relative positions and are interchangeable under appropriate circumstances.

DETAILED DESCRIPTION OF THE DRAWINGS

FIG. 1 illustrates a top view of an actuator 100. Actuator 100 includes a support layer 110, a first stationary structure 120, a second stationary structure 130, and a movable structure 140. Support layer 110 preferably includes a semiconductor substrate or semiconductor layer. Also in the preferred embodiment, support layer 110 also includes a dielectric layer overlying the semiconductor layer or substrate. As an example, the dielectric layer can be comprised of silicon dioxide. Stationary structures 120 and 130 and movable structure 140 are preferably formed from the same layer of electrically conductive material. As an example, a layer of doped, crystalline or polycrystalline silicon can be patterned to form structures 120, 130, and 140.

Stationary structures 120 and 130 each have a comb-like configuration and are both coupled to and are located over support layer 110. Each of stationary structures 120 and 130 comprise a plurality of elongated portions adjacent to each other and separated from each other by a gap. As an example, stationary structure 120 includes adjacent portions 121 and 122 separated by a gap 123. Additionally, stationary structure 130 comprises adjacent portions 131 and 132 separated by a gap 133. Gaps 123 and 133 are illustrated in FIG. 1 to have a constant width, but such gaps may have a non-constant or varying width. In the preferred embodiment, stationary structures 120 and 130 are identical to each other.

Movable structure 140 is coupled to and is located over support layer 110. Movable structure 140 has a first side 141 located adjacent to stationary structure 120 and also has a second side 142 located adjacent to stationary structure 130. Movable structure 140 is movable relative to stationary structures 120 and 130 and also relative to support layer 110.

Movable structure 140 includes a proof mass or seismic mass 150 that is suspended over support layer 110 by suspension beams 151. Beams 151 are coupled to anchors 152, and anchors 152 are coupled to support layer 110. Beams 151 provide the mobility for movable structure 140. Stationary structures 120 and 130 actuate movable structure 140 back and forth along an axis 160. Electrostatic forces are used to provide the actuation. As illustrated in FIG. 1, axis 160 is preferably straight. However, in a different embodiment, axis 160 may be curved as in a radial coordinate system for a radial actuator.

Movable structure 140 also includes a plurality of elongated portions located at or extending from sides 141 and 142 of structure 140. As an example, movable structure 140 includes an elongated portion 143 extending into and located in gap 133 between portions 131 and 132 of stationary structure 130. The elongated portions of movable structure 140 and stationary structures 120 and 130 are inter-digitated to form an inter-digitated comb structure.

Portion 143 comprises an elongated body 144 and a plurality of asymmetric structures 145 extending from body 144. In the preferred embodiment, body 144 has two sides 146 and 147 that are substantially parallel to axis 160. Each of asymmetric structures 145 extends from one of sides 146 or 147 of body 144. A first portion of asymmetric structures 145 is located at side 146 of body 144 and is located between body 144 and portion 131 of stationary structure 130. A second portion of asymmetric structures 145 is located at side 147 of body 144 and is located between body 144 and portion 132 of stationary structure 130.

To improve or increase the electrostatic attraction between stationary structure 130 and portion 143 of movable structure 140, at least a portion of an edge of each of asymmetric structures 145 is non-parallel to axis 160. In the preferred embodiment, this portion of the edge of each of asymmetric structures 145 is also non-perpendicular to axis 160 and non-parallel to the edges of portions 131 or 132 of stationary structure 130 that face toward movable structure 140. This edge of each of asymmetric structures 145 can be curved or can be substantially straight, but preferably extends towards one of the facing edges of portions 131 and 132 of stationary structure 130.

Each of asymmetric structures 145 have a first end 148 coupled to body 144 and also have a second end 149 opposite or distal to end 148. In the preferred embodiment, the nonparallel and non-perpendicular edge of each asymmetric structure extends from end 148 to end 149. Also in the preferred embodiment, the second end 149 of a first one of asymmetric structures 145 is preferably located between one of portions 131 or 132 of stationary structure 130 and the first end 148 of a second one of asymmetric structures 145. Furthermore, the first and second ones of asymmetric structures 145 are preferably adjacent to each other without a third one of asymmetric structures 145 located between the first and second ones of asymmetric structures 145. Alternatively, the third one of asymmetric structures 145 may be located between the first and second ones of asymmetric structures 145.

Portion of 143 of movable structure 140 is preferably symmetrical along a dashed line 170 that extends through the center of body 144 of portion 143. Line 170 is preferably parallel to axis 160, and line 170 separates asymmetric structures 145 located at side 146 of body 144 from asymmetric structures 145 located at side 147 of body 144. In this symmetrical embodiment, each of asymmetrical structures 145 is preferably identical. Alternatively, adjacent ones of asymmetric structures 145 located at the same side of body 144 may have different configurations and still maintain the preferred symmetry of portion 143 of movable structure 140.

Each of asymmetric structures 145 at sides 146 and 147 is spaced apart by a predetermined distance from an adjacent one of asymmetric structures 145 at the same side of body 144. This predetermined distance is preferably constant along both of sides 146 and 147 and is preferably the same on both of sides 146 and 147. Alternatively, the predetermined distance may increase or decrease linearly, geometrically, or exponentially between successive pairs of adjacent asymmetric structures along sides 146 and 147. Furthermore, the size of asymmetric structures 145 can increase or decrease along sides 146 and 147.

In the preferred embodiment each of asymmetric structures 145 have the shape of a fin with a length measured from end 148 to end 149 of approximately five to ten micrometers and a width measured at end 148 of approximately three to seven micrometers. Each of the asymmetric structures 145 preferably have an interior edge that forms a first angle of approximately twenty-five to thirty-five degrees with sides 146 and 147 of body 144 and also have an exterior edge that forms a larger second angle of approximately forty to fifty degrees with sides 146 and 147 of body 144.

As illustrated in FIG. 1, movable structure 140 includes a plurality of elongated portions, such as portion 143, at both of sides 141 and 142 of structure 140. In the preferred embodiment, each of the plurality of elongated portions of movable structure 140 are identical to each other so that structure 140 is symmetric about a line 180. Alternatively, there may be some variation between the elongated portions extending from a single side of the movable structure, but even in this embodiment, the movable structure preferably maintains a line of symmetry similar to line 180.

The following is an explanation of how and why the use of asymmetric structures 145 in actuator 100 increases the electrostatic force per unit area over that of the prior art to permit the use of lower actuation voltages. Electric field lines terminate normal to the conductive surfaces upon which the electric field lines terminate. Electrostatic force vectors are parallel to the electric field lines at the conductive surface. The magnitude of an electrostatic force vector is inversely proportional to a length of the electric field line. Accordingly, the layout or geometry of the inter-digitated comb structure formed by movable structure 140 and stationary structures 120 and 130 can be designed to increase the electrostatic force.

In particular, the use of at least one asymmetric structure 145 in actuator 100 increases the electrostatic force in a region where portion 143 of movable structure 140 overlaps portions 131 and 132 of stationary structure 130. In the prior art where no asymmetric structures are used, the net electrostatic force in the direction of axis 160 at the overlapping region is zero. The prior art relies on a high net electrostatic force in the direction of axis 160 only at a region between the end of the inter-digitated portion of the movable structure and the stationary structure. However, in actuator 100, the net electrostatic force in the direction of axis 160 at the overlapping region can be at least as large as the net electrostatic force in the direction of axis 160 at the region between the end of portion 143 of movable structure 140 and stationary structure 130.

FIG. 2 illustrates a top view of a portion of a different actuator 200, which is similar to actuator 100 of FIG. 1. The portion of actuator 200 illustrated in FIG. 2 can be substituted for a portion 190 of actuator 100 in FIG. 1. One skilled in the art will understand that the illustrated portion of actuator 200 would be replicated along both sides of a movable structure in a manner similar to that illustrated for actuator 100 in FIG. 1.

Actuator 200 includes a movable structure 240, which is similar to movable structure 140 in FIG. 1. Structure 240 includes a side 242 and a portion 243 extending from side 242. Portion 243 comprises body 144 and a plurality of asymmetric structures 245 extending from sides 146 and 147 of body 144.

Asymmetric structures 245 are similar to asymmetric structures 145 in FIG. 1. For example, each of asymmetric structures 245 in FIG. 2 have a first end 248 coupled to body 144 and a second end 249 opposite first end 248. Additionally, each of asymmetric structures 245 has an edge that extends from end 248 to end 249 and that is non-parallel and preferably non-perpendicular to axis 160. However, a predetermined distance separating some of asymmetric structures 245 is non-constant and in some instances is zero. Furthermore, asymmetric structures 245 along side 146 of body 144 have different sizes and shapes representing examples of different configurations for asymmetric structures 245, and asymmetric structures 245 along side 147 of body 144 have different sizes and shapes representing other examples of different configurations for asymmetric structure 245. Nevertheless, portion 243 remains substantially symmetrical about line 170.

FIG. 3 illustrates a top view of a portion of an actuator 300, which is similar to actuator 100 and 200 in FIGS. 1 and 2, respectively. The portion of actuator 300 illustrated in FIG. 3 can be substituted for a portion 190 of actuator 100 in FIG. 1. One skilled in the art will understand that the illustrated portion of actuator 300 would be replicated along both sides of a movable structure in a manner similar to that illustrated for actuator 100 in FIG. 1.

Actuator 300 includes a movable structure 340, which is similar to movable structure 140 in FIG. 1. Structure 340 includes a side 342 and a portion 343 extending from side 342. Portion 343 comprises body 144 and a plurality of asymmetric structures 345 extending from sides 146 and 147 of body 144.

Asymmetric structures 345 are similar to asymmetric structures 145 in FIG. 1. For example, each of asymmetric structures 345 in FIG. 3 have a first end 348 coupled to body 144 and a second end 349 opposite first end 348. Additionally, each of asymmetric structures 345 has an edge that extends from end 348 to end 349 and that is non-parallel and preferably non-perpendicular to axis 160. However, the edges of asymmetric structures 345 that are non-parallel and non-perpendicular to axis 160 are curved. Furthermore, asymmetric structures 345 along side 146 of body 144 have different sizes and shapes representing examples of different configurations for asymmetric structures 345, and asymmetric structures 345 along side 147 of body 144 have different sizes and shapes representing other examples of different configurations for asymmetric structure 345. In the preferred embodiment, each of asymmetric structures 345 is identical such that portion 343 remains symmetrical about line 170.

FIG. 4 illustrates a top-view of a portion of an actuator 400, which is similar to actuators 100, 200, and 300 in FIGS. 1, 2 and 3, respectively. The portion of actuator 400 illustrated in FIG. 4 can be substituted for a portion 190 of actuator 100 in FIG. 1. One skilled in the art will understand that the illustrated portion of actuator 400 would be replicated along both sides of a movable structure in a manner similar to that illustrated for actuator 100 in FIG. 1.

Actuator 400 includes a movable structure 440, which is similar to movable structure 140 in FIG. 1. Structure 440 includes a side 442 and a portion 443 extending from side 442. Portion 443 comprises body 144 and a plurality of asymmetric structures 445 extending from sides 146 and 147 of body 144.

Asymmetric structures 445 are similar to asymmetric structures 145 in FIG. 1. For example, each of asymmetric structures 445 in FIG. 4 have a first end 448 coupled to body 144 and a second end 449 opposite first end 448. Additionally, each of asymmetric structures 445 has an edge that extends from end 448 to end 449 and that is non-parallel and preferably non-perpendicular to axis 160. However, portion 443 includes only a single asymmetric structure 445 along each of sides 146 and 147 of body 144. Nevertheless, portion 443 remains symmetrical about line 170.

Figure 5:
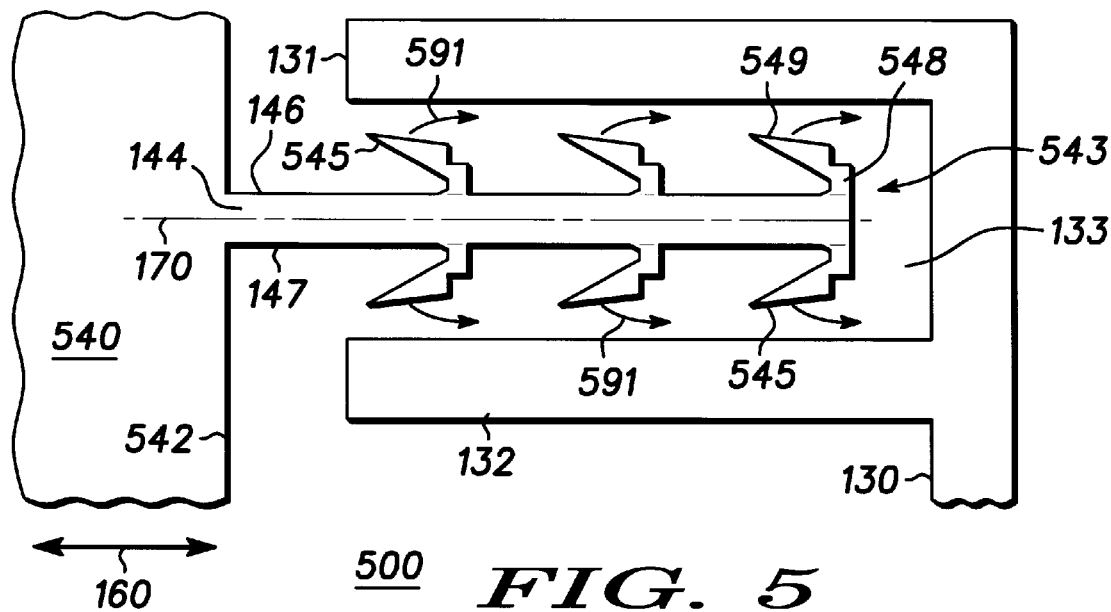

FIG. 5 illustrates a top view of a portion of an actuator 500, which is similar to actuators 100, 200, 300, 400 in FIGS. 1, 2, 3, and 4, respectively. The portion of actuator 500 illustrated in FIG. 5 can be substituted for a portion 190 of actuator 100 in FIG. 1. One skilled in the art will understand that the illustrated portion of actuator 500 would be replicated along both sides of a movable structure in a manner similar to that illustrated for actuator 100 in FIG. 1.

Actuator 500 includes a movable structure 540, which is similar to movable structure 140 in FIG. 1. Structure 540 includes a side 542 and a portion 543 extending from side 542. Portion 543 comprises body 144 and a plurality of asymmetric structures 545 extending from sides 146 and 147 of body 144.

Asymmetric structures 545 are similar to asymmetric structures 145 in FIG. 1. For example, each of asymmetric structures 545 in FIG. 5 have a first end 548 coupled to body 144 and a second end 549 opposite first end 548. Additionally, each of asymmetric structures 545 has an edge that extends from end 548 to end 549 and that is non-parallel and preferably non-perpendicular to axis 160.

However, asymmetric structures 545 are not stationary relative to body 144, but are movable relative to body 144 in a direction indicating by arrows 591. The independent mobility of asymmetric structures 545 further improve or increase the actuation of movable structure 540. Nevertheless, portion 543 remains symmetrical about line 170.

Figure 6:
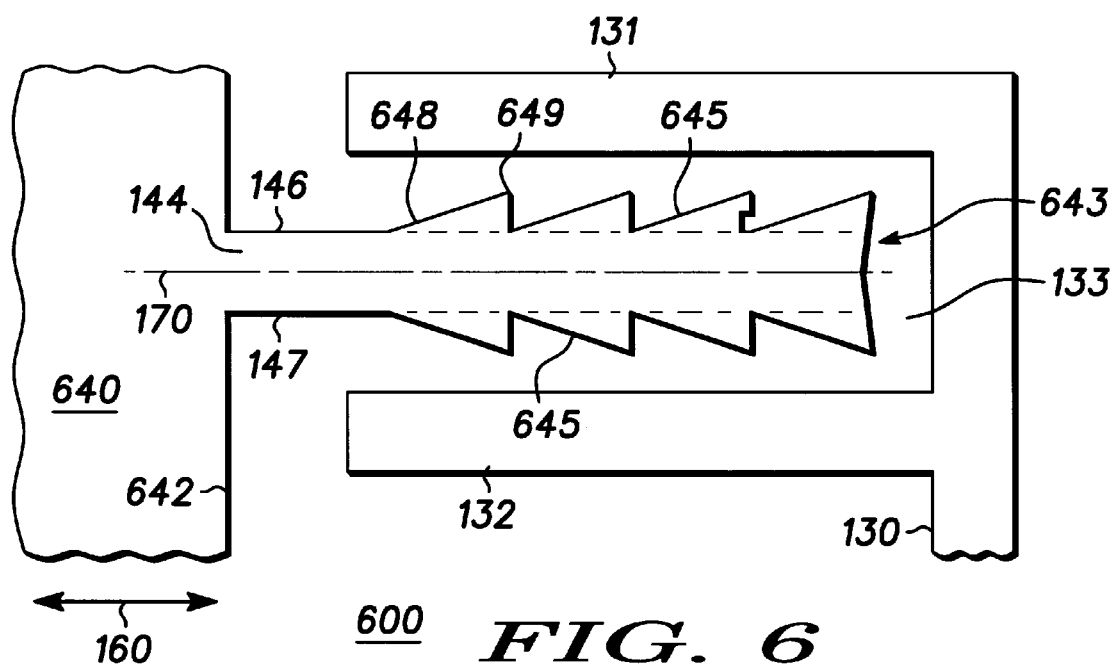

FIG. 6 illustrates a top view of a portion of an actuator 600, which is similar to actuators 100, 200, 300, 400, and 500 of FIGS. 1, 2, 3, 4, and 5, respectively. The portion of actuator 600 illustrated in FIG. 6 can be substituted for a portion 190 of actuator 100 in FIG. 1. One skilled in the art will understand that the illustrated portion of actuator 600 would be replicated along both sides of a movable structure in a manner similar to that illustrated for actuator 100 in FIG. 1.

Actuator 600 includes a movable structure 640, which is similar to movable structure 140 in FIG. 1. Structure 640 includes a side 642 and a portion 643 extending from side 642. Portion 643 comprises body 144 and a plurality of asymmetric structures 645 extending from sides 146 and 147 of body 144.

Asymmetric structures 645 are similar to asymmetric structures 145 in FIG. 1. For example, each of asymmetric structures 645 in FIG. 6 have a first end 648 coupled to body 144 and a second end 649 opposite first end 648. Additionally, each of asymmetric structures 645 has an edge that extends from end 648 to end 649 and that is non-parallel and preferably non-perpendicular to axis 160. Furthermore, asymmetric structures 645 along side 146 of body 144 have different sizes and shapes representing examples of different configurations for asymmetric structures 645, and asymmetric structures 645 along side 147 of body 144 have different sizes and shapes representing other examples of different configurations for asymmetric structure 645. In the preferred embodiment, each of asymmetric structures 645 is identical such that portion 643 remains symmetrical about line 170.

Portion 643 is different from portions 143, 243, 343, 443, and 543 in FIGS. 1, 2, 3, 4, and 5, respectively, in that portion 643 is designed to push movable structure 640 away from stationary structure 130 along axis 160 whereas portions 143, 243, 343, 443, and 543 are designed to pull the associated moveable structure towards stationary structure 130 along axis 160. One skilled in the art will understand that asymmetric structures 645 can be reversed, turned around, or rotated by 180° to provide an embodiment for pulling movable structure 640 towards stationary structure 130 along axis 160. Similarly, asymmetric structures 145, 245, 345, 445, and 545 and FIGS. 1, 2, 3, 4, and 5, respectively, can also be reversed, turned around, or rotated by 180° to provide embodiments for pushing the associated movable structure away from stationary structure 130 along axis 160.

In another embodiment, the elongated portions along each side of the movable structure can alternate between pushing an pulling the movable structure. In other words, one elongated portion at a first side of a movable structure is designed to pull the movable structure towards a first stationary structure at the first side of the movable structure while a different elongated structure along the first side of the movable structure is designed to push the movable structure towards a second stationary structure at the first side of the movable structure. This embodiment uses two different stationary structures along each side of the movable structure, where the two stationary structures along a particular side of the movable structure are electrically biased in opposite directions at different times. In yet another embodiment, the elongated portions along one side of the movable structure can be designed to push the movable structure while the elongated structures along the opposite side of the movable structure are designed to pull the movable structure.

Figure 7:
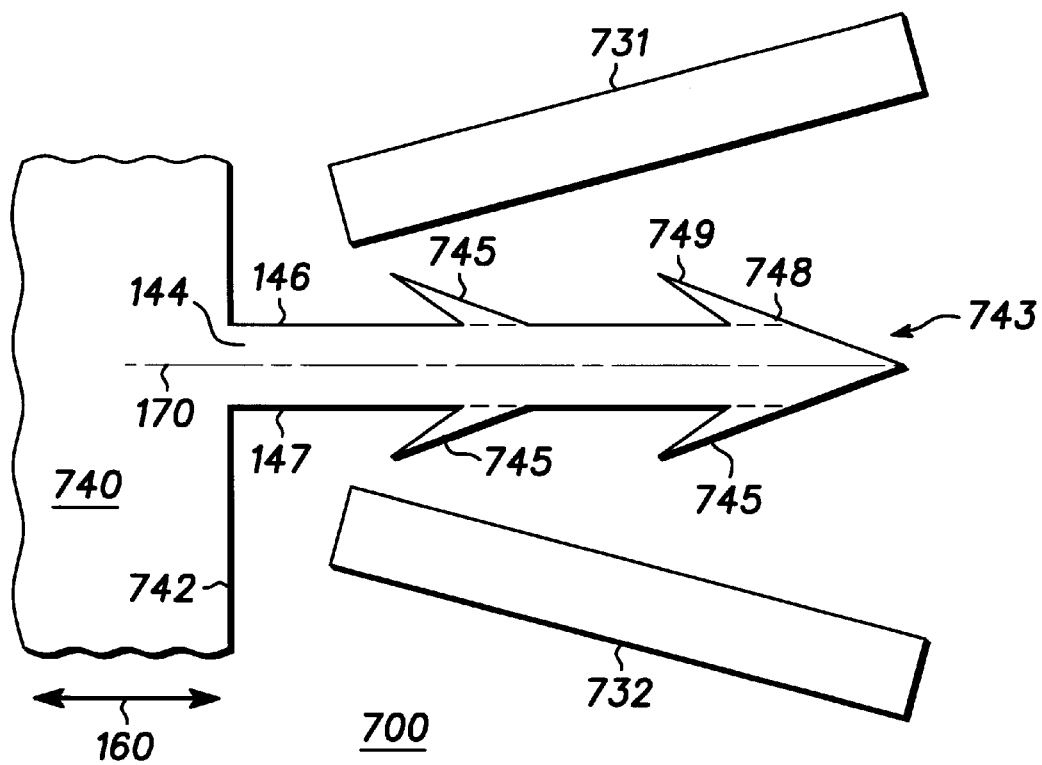

FIG. 7 illustrates a top view of a portion of an actuator 700, which is similar to actuators 100, 200, 300, 400, 500, and 600 of FIGS. 1, 2, 3, 4, 5, and 6, respectively. The portion of actuator 700 illustrated in FIG. 7 can be substituted for a portion 190 of actuator 100 in FIG. 1. One skilled in the art will understand that the illustrated portion of actuator 700 would be replicated along both sides of a movable structure in a manner similar to that illustrated for actuator 100 in FIG. 1.

Actuator 700 includes a movable structure 740, which is similar to movable structure 140 in FIG. 1. Structure 740 includes a side 742 and a portion 743 extending from side 742. Portion 743 comprises body 144 and a plurality of asymmetric structures 745 extending from sides 146 and 147 of body 144.

Asymmetric structures 745 are similar to asymmetric structures 145 in FIG. 1. For example, each of asymmetric structures 745 in FIG. 7 have a first end 748 coupled to body 144 and a second end 749 opposite first end 748. Additionally, each of asymmetric structures 745 has an edge that extends from end 748 to end 749 and that is non-parallel and preferably non-perpendicular to axis 160. In the preferred embodiment, each of asymmetric structures 745 is identical such that portion 743 remains symmetrical about line 170.

Actuator 700 also includes a stationary structure having portions 731 and 732, which are similar to portions 131 and 132 of stationary structure 130 in FIG. 1. Portion 743 of movable structure 740 is located between portions 731 and 732. However, portions 731 and 732 in FIG. 7 each have an edge that faces towards portion 743 of structure 740 and that is non-parallel and preferably non-perpendicular to axis 160. One skilled in the art will understand that actuator 700 is a non-latching actuator because portion 743 will not latch with portions 731 and 732 as the electric field between portion 743 and portions 731 and 732 increases.

Figure 8:
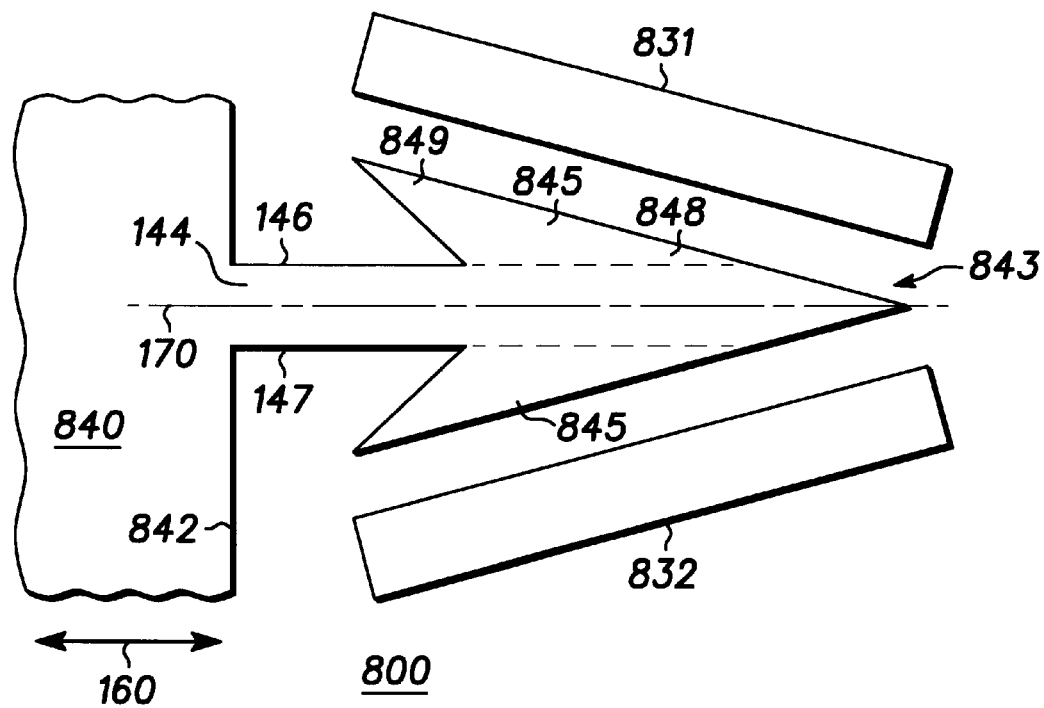

FIG. 8 illustrates a top view of a portion of an actuator 800, which is similar to actuators 100, 200, 300, 400, 500, 600, and 700 of FIGS. 1, 2, 3, 4, 5, 6, and 7, respectively. The portion of actuator 800 illustrated in FIG. 8 can be substituted for a portion 190 of actuator 100 in FIG. 1. One skilled in the art will understand that the illustrated portion of actuator 800 would be replicated along both sides of a movable structure in a manner similar to that illustrated for actuator 100 in FIG. 1.

Actuator 800 includes a movable structure 840, which is similar to movable structure 140 in FIG. 1. Structure 840 includes a side 842 and a portion 843 extending from side 842. Portion 843 comprises body 144 and an asymmetric structure 845 extending from each of sides 146 and 147 of body 144.

Asymmetric structures 845 are similar to asymmetric structures 145 in FIG. 1. For example, each of asymmetric structures 845 in FIG. 8 have a first end 848 coupled to body 144 and a second end 849 opposite first end 848. Additionally, each of asymmetric structures 845 has an edge that extends from end 848 to end 849 and that is non-parallel and preferably non-perpendicular to axis 160. In the preferred embodiment, each of asymmetric structures 845 is identical such that portion 843 remains symmetrical about line 170.

Actuator 800 also includes a stationary structure have portions 831 and 832, which are similar to portions 131 and 132 of stationary structure 130 in FIG. 1. Portion 843 of movable structure 840 is located between portions 831 and 832. However, portions 831 and 832 in FIG. 8 each have an edge that faces towards portion 843 of structure 840 and that is non-parallel and preferably non-perpendicular to axis 160, but that is parallel to the outer edge of asymmetric structures 845. One skilled in the art will understand that actuator 800 is a latching actuator because portion 843 will latch with portions 831 and 832 as the electric field between portion 843 and portions 831 and 832 increases. Actuator 800 is more efficient than prior art latching actuators with respect to the displacement of portion 843 along axis 160 versus the applied differential voltage applied between portion 843 and portions 831 and 832.

Therefore, an improved actuator is provided to overcome the disadvantages of the prior art. The actuators described herein generate a larger electrostatic force per unit area than actuators of the prior art. Accordingly, these actuators can use lower actuation voltages. The lower voltages can increase the battery life in portable applications, and the lower voltages can also reduce the size, and thus the cost, of the actuator.

Although the invention has been described with reference to specific embodiments, it will be understood by those skilled in the art that various changes may be made without departing from the spirit or scope of the invention. For instance, the numerous details set forth herein such as, for example, the specific number, shape and/or size of the asymmetric structures are provided to facilitate the understanding of the invention and are not provided to limit the scope of the invention. Furthermore, motion stops and/or symmetric anti-stiction bumps can be added to the movable and/or stationary structures to limit the motion and/or to inhibit stiction of the movable structures. Moreover, an actuator can include asymmetric structures on both the movable structure and the stationary structure. Additionally, the movable structure may have a single asymmetric structure or may have all of the asymmetric structures at a single side of the movable structure. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An actuator comprising:

a support layer;

a stationary structure coupled to and located over the support layer and comprising two portions adjacent to each other and separated from each other by a gap; and a movable structure coupled to and located over the support layer, located adjacent to the stationary structure, and movable in a direction relative to the stationary structure and the support layer, wherein:

a portion of the movable structure is located in the gap between the two portions of the stationary structure, and the portion of the movable structure comprises a body having a side substantially parallel to the direction of movement and an asymmetric structure extending from the side of the body and having an edge non-parallel to the direction of movement.

2. The actuator of claim 1 wherein:

an edge of the asymmetric structure extends towards an edge of a first one of the two portions of the stationary structure; and a portion of the edge of the asymmetric structure is non-parallel to a portion of the edge of the first one of the two portions of the stationary structure.

3. The actuator of claim 1 wherein:

the edge of the asymmetric structure is non-perpendicular to the direction.

4. The actuator of claim 3 wherein:

the edge of the asymmetric structure is substantially straight.

5. The actuator of claim 1 wherein:

the asymmetric structure is movable relative to the body of the portion of the movable structure.

6. The actuator of claim 1 further comprising:

an additional stationary structure located at a first side of the movable structure, coupled to and located over the support layer, and comprising two additional portions adjacent to each other and separated from each other by an additional gap, wherein:
  the stationary structure is located at a second side of the movable structure opposite the first side of the movable structure; and
  an additional portion of the movable structure is located in the additional gap between the two additional portions of the additional stationary structure and comprises an additional body and an additional asymmetric structure extending from the additional body.

7. The actuator of claim 6 wherein:

an edge of the additional asymmetric structure extends towards an edge of a first one of the two additional portions of the additional stationary structure;

a portion of the edge of the additional asymmetric structure is non-parallel to the edge of the first one of the two additional portions of the additional stationary structure;

an edge of the asymmetric structure extends towards an edge of a first one of the two portions of the stationary structure; and a portion of the edge of the asymmetric structure is non-parallel to the edge of the first one of the two portions of the stationary structure.

8. The actuator of claim 6 wherein:

the additional stationary structure and the stationary structure actuate the movable structure along an axis; and the additional asymmetric structure and the stationary structure each have an edge non-parallel to the axis.

9. The actuator of claim 8 wherein:

the edge of the additional asymmetric structure and the edge of the asymmetric structure are non-perpendicular to the axis.

10. The actuator of claim 8 wherein:

the additional body has a side substantially parallel to the axis; and the asymmetric structure extends from the side of the additional body.

11. A semiconductor actuator comprising:

a semiconductor layer;

a first stationary structure coupled to and located over the semiconductor layer and comprising two first portions adjacent to each other and separated from each other by a first gap;

a second stationary structure coupled to and located over the semiconductor layer and comprising two second portions adjacent to each other and separated from each other by a second gap; and a movable structure coupled to and located over the semiconductor layer, having a first side located adjacent to the first stationary structure, having a second side located adjacent to the second stationary structure, and movable relative to the first and second stationary structures and the semiconductor layer, wherein:
  a first portion of the movable structure is located in the first gap between the two first portions of the first stationary structure;
  the first portion of the movable structure comprises a first body and a first plurality of asymmetric structures extending from the first body;
  a first portion of the first plurality of asymmetric structures is located between the first body and a first one of the two first portions of the first stationary structure;
  a second portion of the first plurality of asymmetric structures is located between the first body and a second one of the two first portions of the first stationary structure;
  the first stationary structure actuates the movable structure along an axis;
  each of the first plurality of asymmetric structures have an edge non-parallel to the axis;
  a second portion of the movable structure is located in the second gap between the two second portions of the second stationary structure;
  the second portion of the movable structure comprises a second body and a second plurality of asymmetric structures extending from the second body;
  a first portion of the second plurality of asymmetric structures is located between the second body and a first one of the two second portions of the second stationary structure;
  a second portion of the second plurality of asymmetric structures is located between the second body and a second one of the two second portions of the second stationary structure;
  the second stationary structure actuates the movable structure along the axis; and
  each of the second plurality of asymmetric structures have an edge non-parallel to the axis.

12. The semiconductor actuator of claim 11 wherein:

the edge of each of the first plurality of asymmetric structures is non-perpendicular to the axis; and the edge of each of the second plurality of asymmetric structures is non-perpendicular to the axis.

13. The semiconductor actuator of claim 11 wherein:

the first body has two sides substantially parallel to the axis;

each of the first plurality of asymmetric structures extends from one of the two sides of the first body;

the second body has two sides substantially parallel to the axis; and each of the second plurality of asymmetric structures extends from one of the two sides of the second body.

14. The semiconductor actuator of claim 11 wherein:

each of the first and second pluralities of asymmetric structures have a length of approximately 5–10 micrometers and a width of approximately 3–7 micrometers.

15. The semiconductor actuator of claim 14 wherein:

the edge of each of the first plurality of asymmetric structures forms an angle of approximately forty to fifty degrees with the first body; and the edge of each of the second plurality of asymmetric structures forms the angle with the first body.

16. A method of manufacturing an actuator comprising:

providing a support layer;

providing a first layer over the support layer; and forming a movable structure and a stationary structure in the first layer, wherein:
  the movable structure is movable relative to the stationary structure and the support layer;
  the stationary structure comprises two portions located adjacent to each other and separated by a gap there between; and
  a portion of the movable structure is located between the two portions of the stationary structure and comprises a body and an asymmetric structure extending from the body.

* * * * *